United States Patent [19]
Matsumoto et al.

[11] Patent Number: 5,403,781
[45] Date of Patent: Apr. 4, 1995

[54] METHOD OF FORMING MULTILAYERED WIRING

[75] Inventors: Yasuhiko Matsumoto; Hattori Atsuo, both of Hamamatsu, Japan

[73] Assignee: Yamaha Corporation, Hamamatsu, Japan

[21] Appl. No.: 93,180

[22] Filed: Jul. 16, 1993

[30] Foreign Application Priority Data

Jul. 17, 1992 [JP] Japan .................................. 4-213301

[51] Int. Cl.⁶ .......................................... H01L 21/311
[52] U.S. Cl. ..................................... 437/195; 437/190; 437/192; 437/228; 437/227
[58] Field of Search ................ 437/190, 192, 195, 228, 437/229

[56] References Cited

U.S. PATENT DOCUMENTS

| | | |
|---|---|---|
| 5,036,382 | 7/1991 | Yamaha . |
| 5,190,894 | 3/1993 | Taneda et al. ........................ 437/195 |
| 5,219,788 | 6/1993 | Abernathey et al. ................ 437/187 |

FOREIGN PATENT DOCUMENTS

| | | | |
|---|---|---|---|
| 63-292649 | 11/1988 | Japan .................................... 437/229 |
| 3-183120 | 8/1991 | Japan .................................... 437/229 |
| 547936 | 2/1993 | Japan . |

OTHER PUBLICATIONS

Wolf et al., Silicon Processing, vol. 1, Lattice Press, 1986, pp. 407–420.

*Primary Examiner*—T. N. Quach
*Attorney, Agent, or Firm*—Spensley Horn Jubas & Lubitz

[57] ABSTRACT

A multi-layered wiring structure, having a first level metal wiring layer and a second level metal wiring layer, is formed on a semiconductor substrate. A first level interlayer insulating film which has an undulation caused by the first level metal wiring layer, a second level metal wiring layer which also has an uneven surface, and a second level interlayer insulating layer are consecutively deposited on the semiconductor substrate. A reflection preventing film (TiN) of 80 nm or more thickness is deposited over the second level interlayer insulating film, and a resist layer is coated on the reflection preventing film. Then, an ultra-violet ray is irradiated through a patterning mask to make an opening corresponding to a contact hole. The reflection preventing film constrains a multi-reflection of the ultra-violet ray. Thus, an accuracy of the patterning of the contact hole is improved.

18 Claims, 11 Drawing Sheets

METHOD OF FORMING MULTILAYERED WIRING

BACKGROUND OF THE INVENTION

The present invention relates to a method of forming multilayered wiring, to be used when manufacturing an integrated circuit device such as an LSI.

Figure 3:
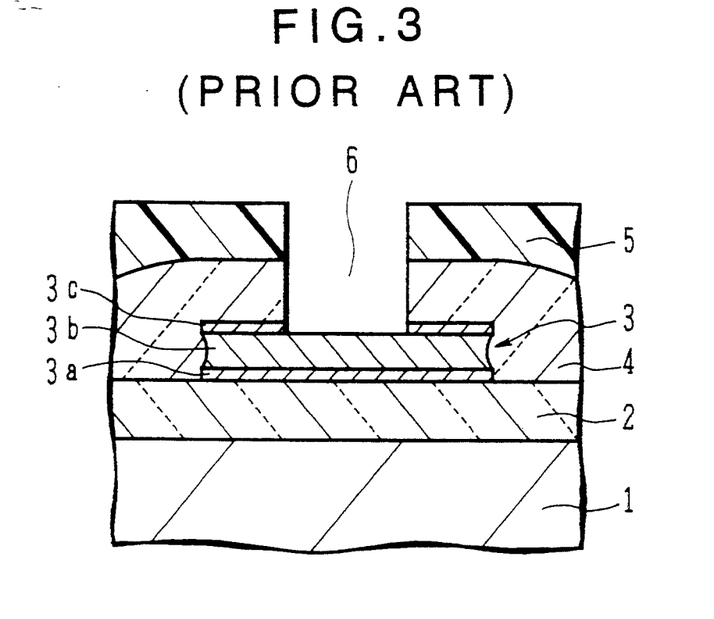
FIGS. 3 and 4 are cross sections of a semiconductor substrate illustrating a conventional multilayered wiring forming method.
Figure 4:
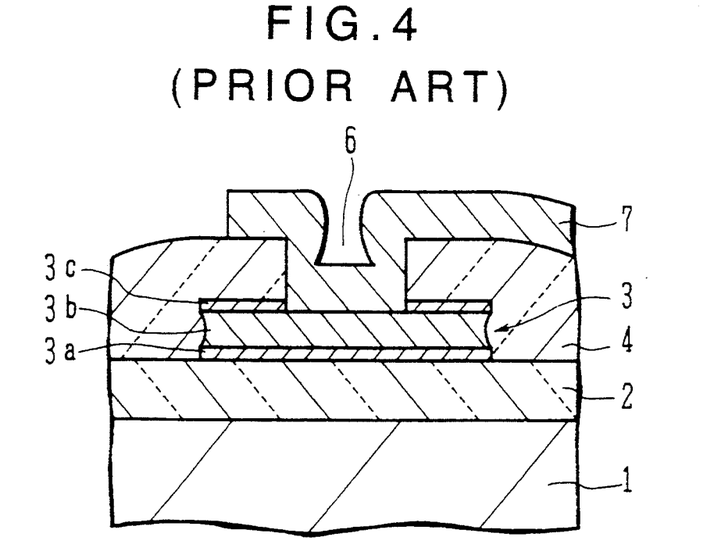

In a conventional method of precisely forming a resist pattern for a contact hole to be formed in an interlayer insulating film, a reflection preventing film such as TiN is deposited on the surface of an underlie wiring layer prior to forming an interlayer insulating film covering the underlie wiring layer (for example, refer to Japanese Patent Laid-open Publication No. 1-266746). FIGS. 3 to 4 illustrate an example of a conventional multilayered wiring forming method of this type.

In the processes illustrated in FIG. 3, TiN, Al alloy (e.g., Al-Cu), and TiN are sequentially deposited on an insulating film 2 such as SiO$_2$ covering the surface of a semiconductor substrate 1 such as Si. These layers are patterned to form a wiring layer 3 made of a TiN layer 3a, an Al alloy layer 3b, and a TiN layer 3c. The TiN layer 3a is used as a barrier layer, and the TiN layer 3c directly deposited on the Al alloy layer 3b is used as a reflection preventing film. As the TiN layer 3a, Al alloy 3b, TiN layer 3c are deposited on a flat surface of the semiconductor substrate, the TiN layer 3a, 3c and the Al alloy layer 3b also have flat surfaces thereon.

Next, an interlayer insulating film 4 such as phosphosilicate glass (PSG) or plasma enhanced CVD SiO$_2$ is formed on the wiring layer 3 while covering the insulating film 2. After smoothing the surface of the interlayer insulating film 4, a resist layer 5 is formed. The resist layer 5 is exposed and developed to form an opening corresponding to a desired contact hole. Using the resist layer 5 with the opening as a mask, a contact hole 6 is formed in the insulating film 4 by a selective etching process. In this etching process, the TiN layer 3c just under the contact hole 6 is etched to prevent an increase of the contact resistance.

The reflection preventing Film such as the TiN layer 3c covering the surface of a high reflectance wiring layer such as Al alloy and Al prevents light from being reflected from the wiring layer surface during the lithography process. It is possible to prevent a distortion or enlargement of an opening pattern off the resist layer which might otherwise be caused by the light reflected from the wiring layer surface.

In the processes illustrated in FIG. 4, after the resist layer 5 is removed, a wiring material such as Al or Al alloy is deposited on the surface off the device, and patterned to form a wiring layer 7 which is electrically connected via the contact hole 6 to the wiring layer 3.

With the above-described method, however, when the laminated structure of the wiring layer 3 made of the TiN layer 3a, Al alloy layer 3b, and TiN layer 3c is patterned and etched using the resist layer as a mask, the etched Al alloy layer 3b is likely to have side etches, resulting in a reduced width of the Al alloy layer 3b and an increase of wiring resistance, and lowering the resistance against electromigration and stress migration.

Furthermore, a reflection preventing film such as TiN directly deposited on tile surface or a wiring layer may change the characteristics of the wiring layer, requiring a long term reliability evaluation test.

SUMMARY OF THE INVENTION

It is an object of the present invention to provide a novel method of precisely forming a resist pattern for a contact hole by using a reflection preventing film while eliminating the above-described disadvantages.

According to one aspect of the present invention, there is provided a method of forming a multilayered wiring, comprising the steps of (a) forming a first wiring layer on the insulative surface of a substrate, (b) forming an interlayer insulating film on the first wiring layer and covering the insulating surface of the substrate, (c) forming a reflection preventing film on the interlayer insulating film, (d) forming a resist layer on the reflection preventing film, and exposing and developing the resist layer to form an opening corresponding to a contact hole, (e) selectively etching the laminated structure of the reflection preventing film and the interlayer insulating film by using the resist film as a mask to form the contact hole down to the surface of the first wiring layer, (f) removing at least the resist layer among the resist layer and the reflection preventing layer, and (g) forming a second wiring layer on the interlayer insulating film and electrically connecting the second wiring layer to the first wiring layer via the contact hole.

The reflection preventing film left unetched when forming the contact hole may be used as part of the second wiring layer.

Since the reflection preventing film is formed on the interlayer insulating film, light reflection from the interlayer insulating film and first wiring layer is suppressed during the exposure process of the resist layer. Since the reflection preventing film is not formed on the surface of the first wiring layer, side etches will not be formed when patterning the first wiring layer.

If the reflection preventing film left unetched is used as part of the second wiring layer, the second wiring layer has a two-layer structure of, for example, an Al alloy layer and the TiN layer under the Al alloy layer.

As described above, the reflection preventing film formed on the interlayer insulating film suppresses light reflection from the underlie during the resist exposure process, so that a resist pattern for a contact hole can be precisely formed. Furthermore, the reflection preventing film formed directly on the underlie wiring layer can be omitted, forming no side etch during patterning the wiring layer. It is therefore possible to prevent an increase of wiring resistance to be caused by a reduced width of the wiring layer, and to prevent the reliability from being lowered. Still further, since the reflection preventing film is not formed directly on the wiring, a wiring reliability evaluation test is not needed.

DETAILED DESCRIPTION OF THE PREFERRED EMBODIMENTS

Figure 1A:
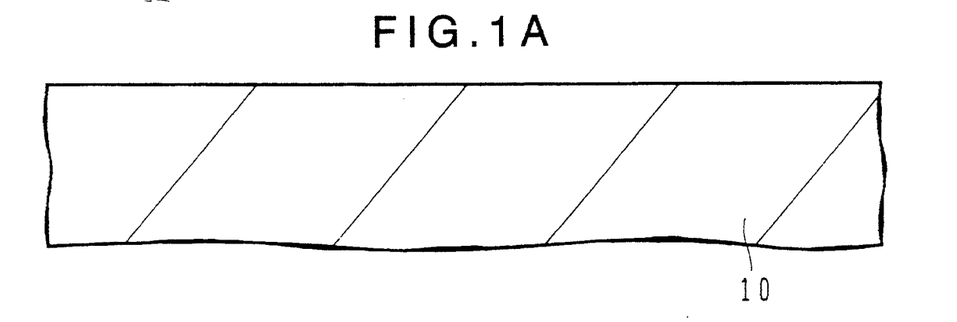
FIGS. 1A to 1N and 2 are cross sections of a semiconductor substrate illustrating a multilayered wiring forming method according to an embodiment of the present invention.
Figure 1B:
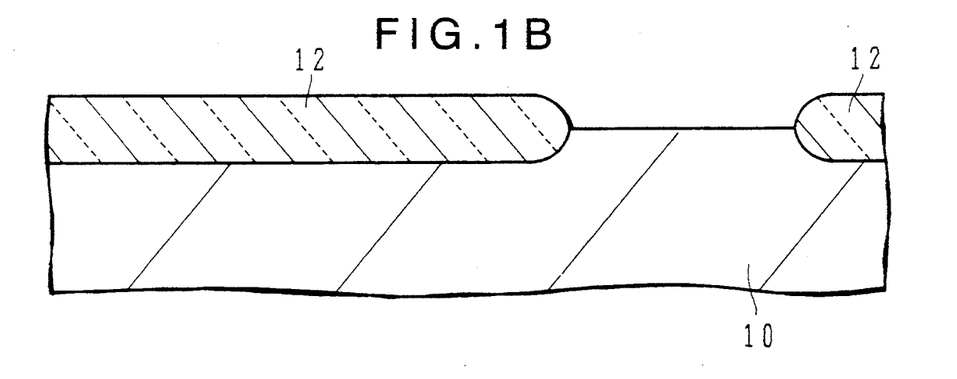
Figure 1C:
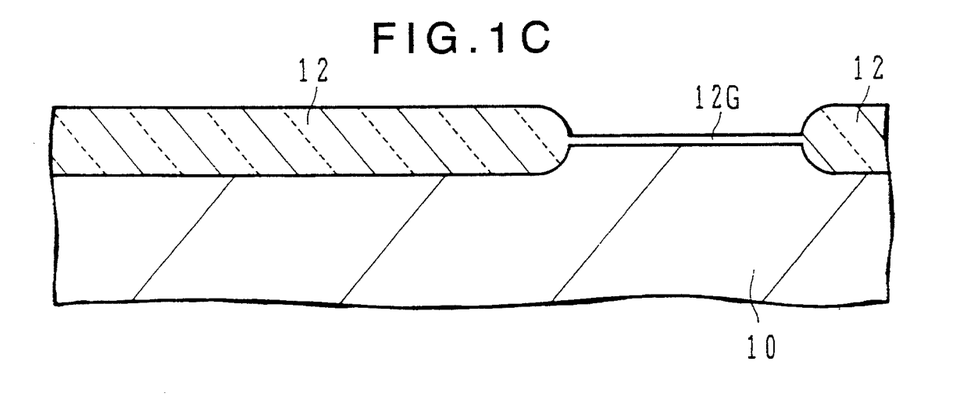
Figure 1D:
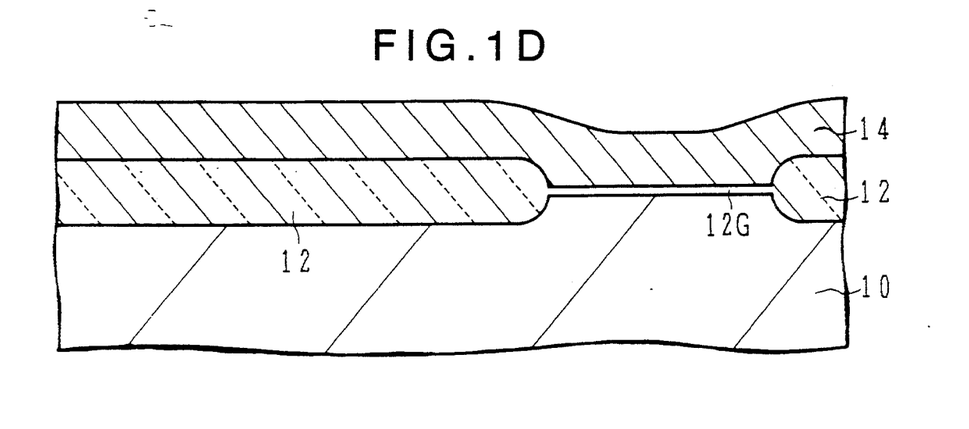
Figure 1E:
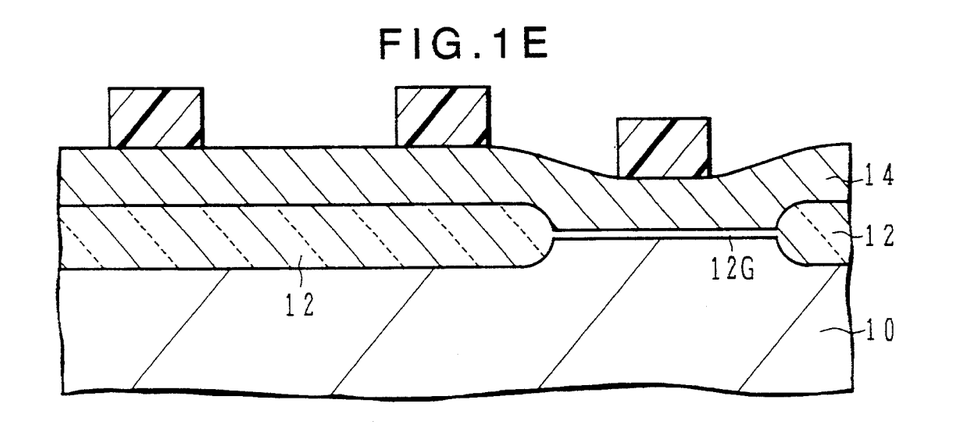
Figure 1F:
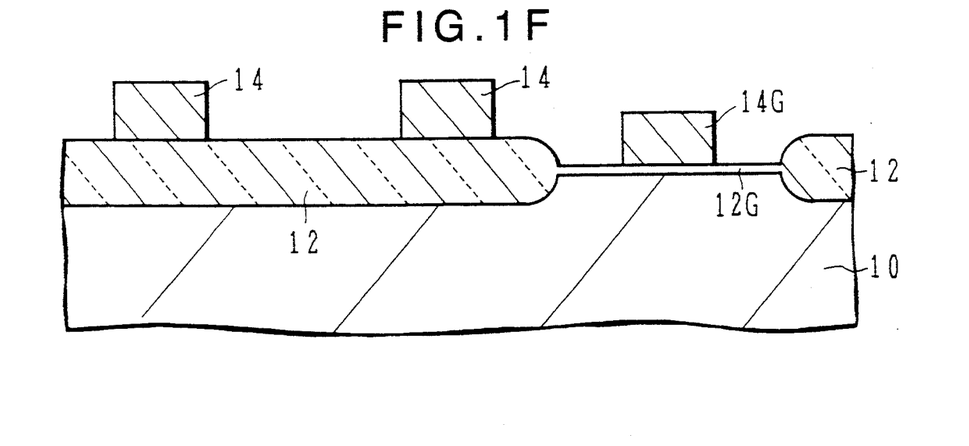
Figure 1G:
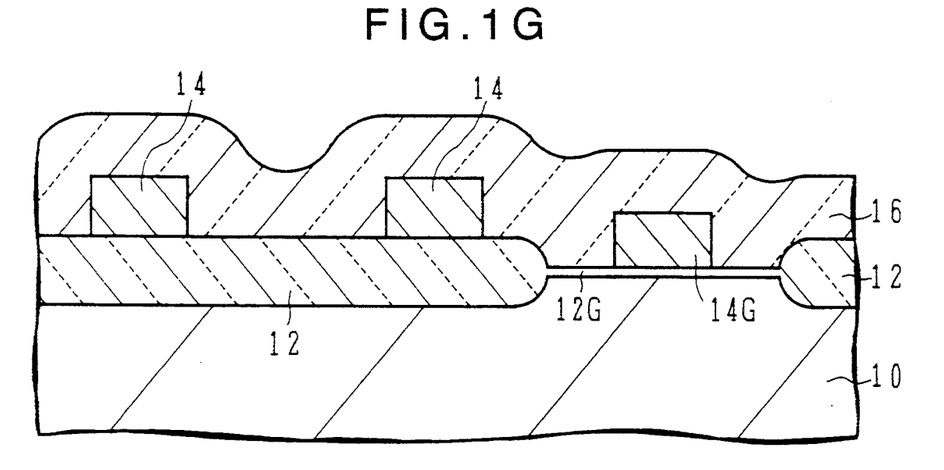
Figure 1H:
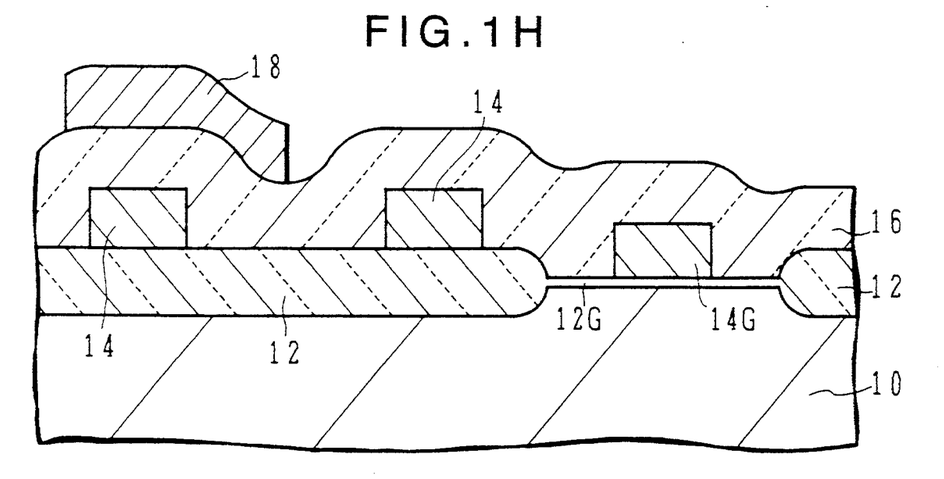
Figure 1I:
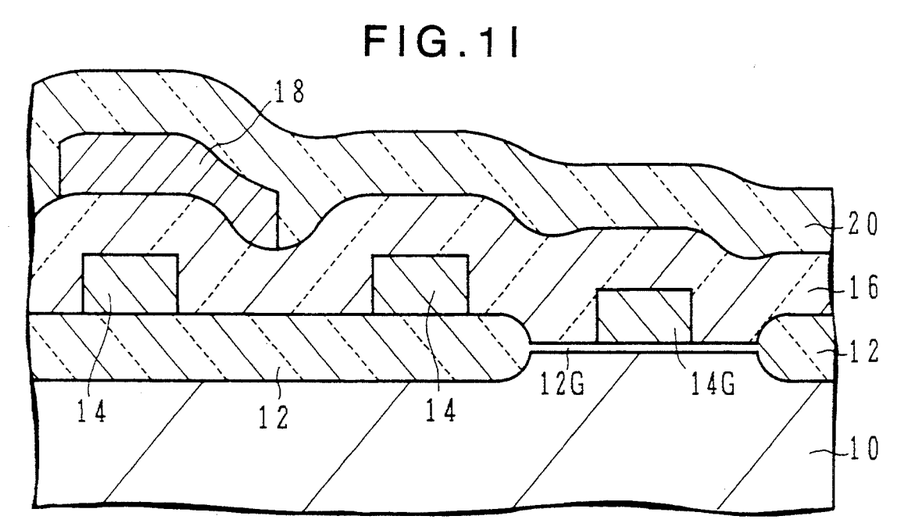
Figure 1J:
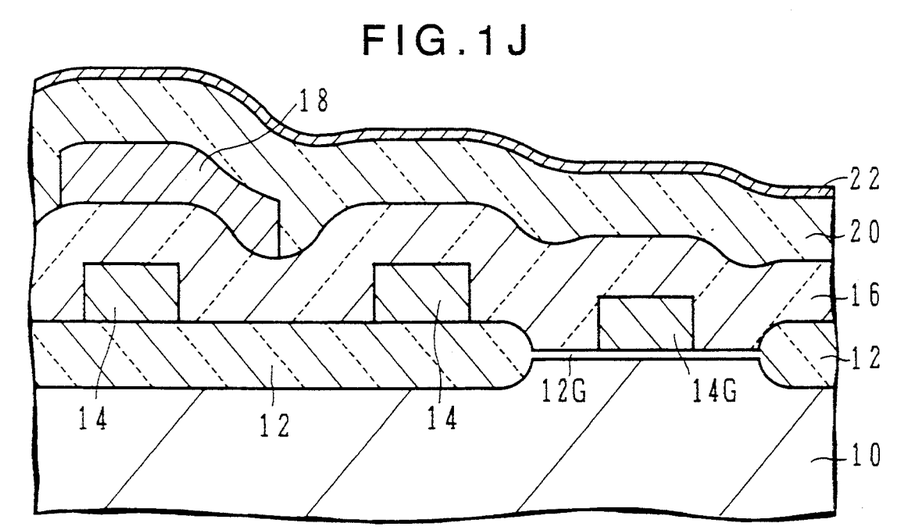
Figure 1K:
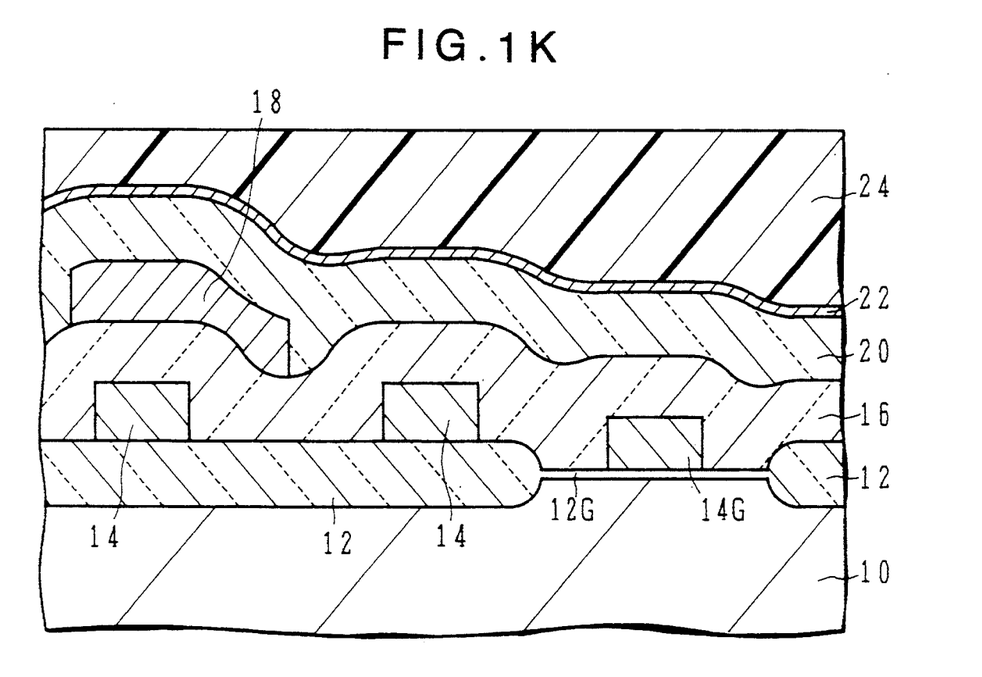
Figure 1L:
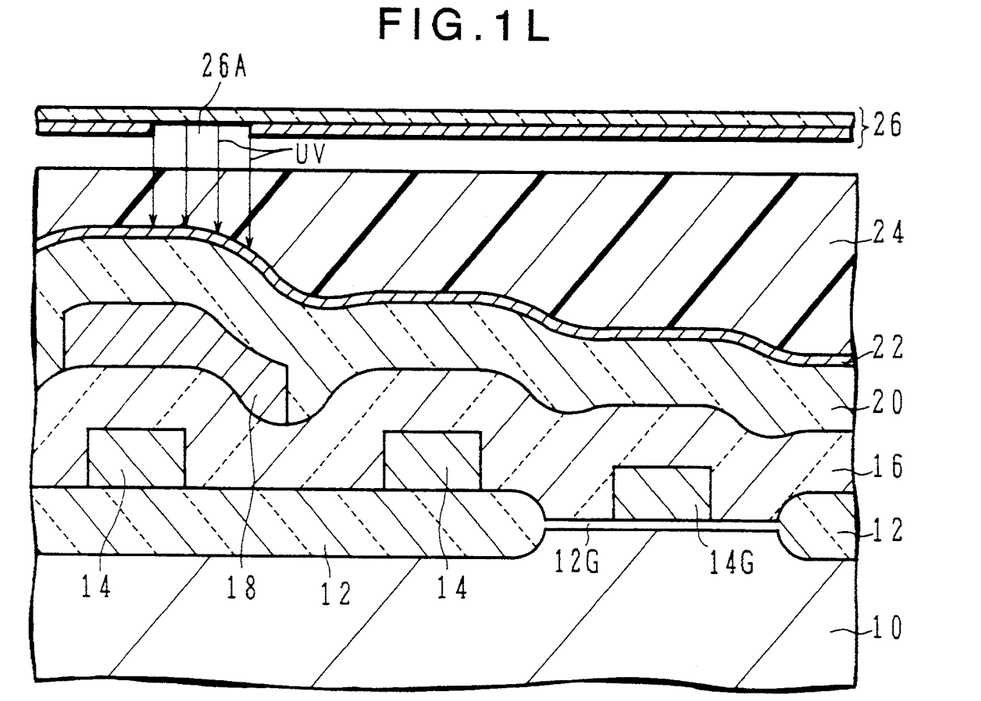
Figure 1M:
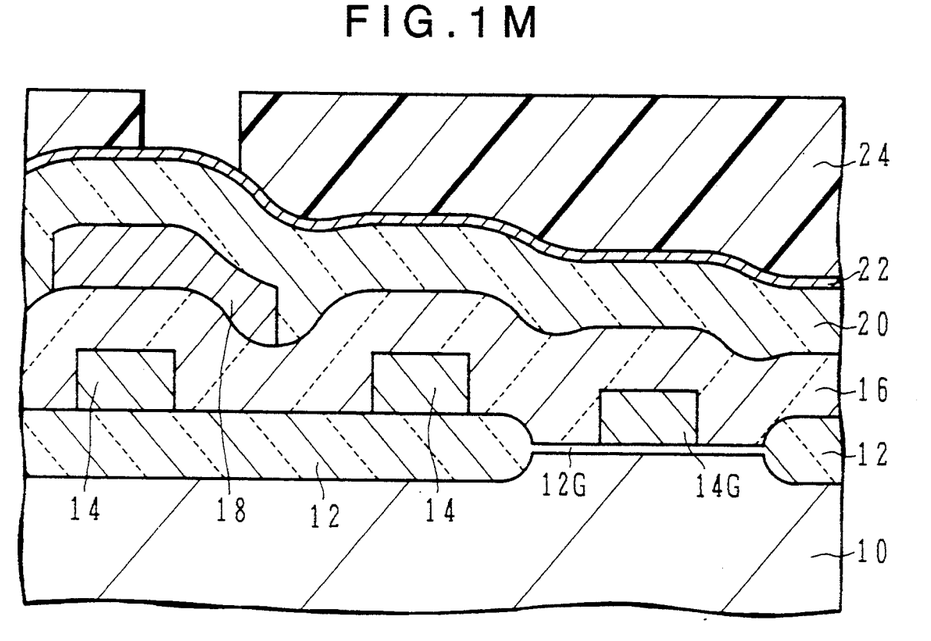
Figure 1N:
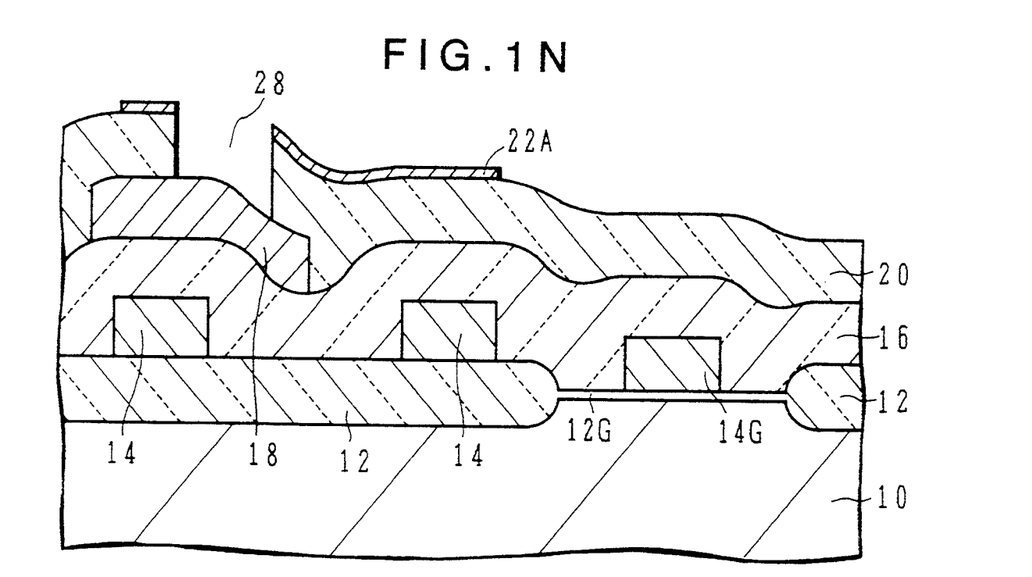
Figure 2:
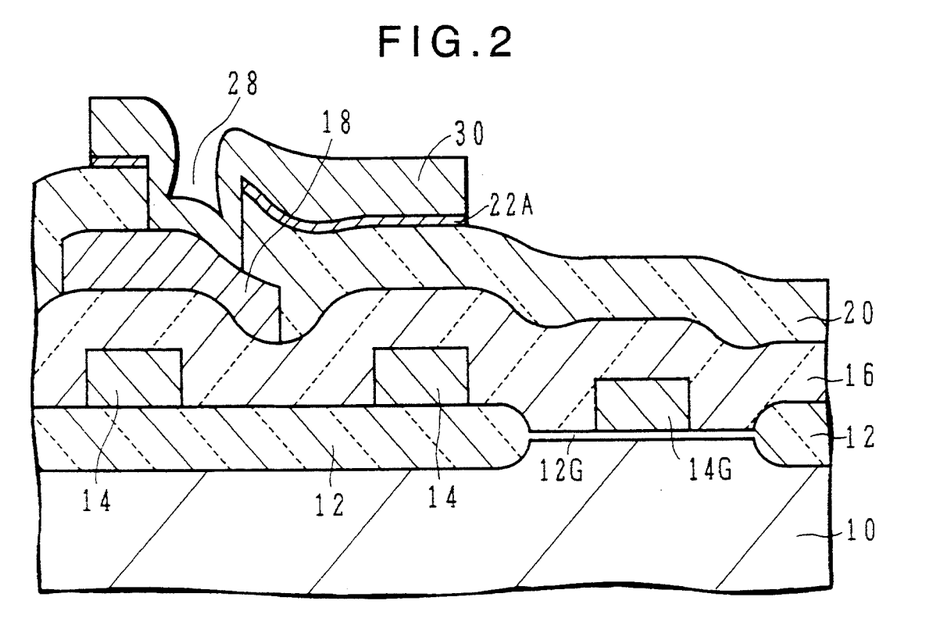

FIGS. 1A to 1N and 2 illustrate a multilayered wiring forming method according to an embodiment of the present invention. The processes (1) and (2) of this method corresponding to FIGS. 1A to 1N and 2 will be described in this order.

(1) On the surface of a semiconductor substrate 10 (FIG. 1A) made of Si for example, a field insulating film 12 made of silicon oxide (thick field oxide film) is formed by means of a selective oxidization process or local oxidization of silicon (LOCOS) process (FIG. 1B). Thereafter, a gate insulating film 12G made of silicon oxide is formed by a thermal oxidization method (FIG. 1C). An electrode material such as polycrystalline silicon is deposited on the upper surface of the substrate to a thickness of about 400 nm by a chemical vapor deposition (CVD) method (FIG. 1D). The electrode material is then patterned to form a first-level wiring layer 14 and a gate electrode layer 14G (FIG. 1E, 1F).

Next, an interlayer insulating film 16 of boron-phospho silicate glass (BPSG) is formed on the upper surface of the substrate to cover tile wiring layer 14 and gate electrode layer 14G by a CVD method (FIG. 1G). The insulating film 16 is subjected to a thermal treatment at about 900° C. to improve step coverage by reducing steps caused by underlie layers such as the wiring layer and tile field insulating film. Even with this step reducing process, there remains undulation of the insulating film 16 or a corrugated structure in correspondence to the thickness of the wiring layer, as shown in FIG. 1L.

Next, an Al alloy such as Al-Cu is deposited on the insulating film 16 by a sputtering method, and patterned to form another wiring layer 18 as a second level wiring layer (FIG. 1H). It is necessary to prevent reflection particularly at the region where the wiring layer 18 is formed on the swell of the insulating film 16 as shown in FIG. 1H because light is likely to be reflected from this region during the resist exposure process.

Next, an interlayer insulating film 20 is formed on the wiring layer 18 while covering the insulating layer 16 by a plasma CVD method (FIG. 1I). The interlayer insulating film 20 is made of high quality $SiO_2$ and spin-on-glass (SOG) having a good flatness. The second metal wiring layer is uneven because of the existence of the first metal wiring layer and the interlayer insulating film deposited below the second metal wiring layer. Thus, when ultra violet ray is irradiated over a resist layer and a second level interlayer insulating film to be deposited on the second level wiring layer to make a contact hole reaching the second metal layer, the ultra violet ray is reflected at the second metal layer, and then the ultra violet ray is scattered not only in the vertical direction but also in oblique directions with respect to the vertical direction. Thus, the patterning accuracy is degraded. Additionally, a multi-reflection will occur as described below. Therefore, a reflection preventing film 22 such as a TiN film is formed on the insulating film 20 to a thickness of 80 nm or more (FIG. 1J). The TiN film may be formed by a reactive sputtering method using Ar, $N_2$, and a Ti target, by an ECR plasma CVD method using $TiCl_4$ gas, or by other methods.

Next, a resist layer 24 is formed on the upper surface of the substrate by a rotary coating (spin coating) method or the like (FIG. 1K). The resist layer 24 undergoes an exposure process to form a contact hole. Specifically, an ultraviolet ray (UV) is applied to the resist layer 24 via a light transmission section 26A of an exposure mask 26 corresponding to a desired contact hole, to thereby print a contact hole pattern on the resist layer 24 (FIG. 1L). Thereafter, the resist layer 24 undergoes a development process to form an opening corresponding to the transmission section 26A of the exposure mask 26 (FIG. 1M). Light transmitted through the resist layer 24 is absorbed by the reflection preventing film 22. Even if there are some irregularly reflected light, the divergence of this light from the opening is small because the reflection preventing film 22 is provided just under the resist layer 24.

(2) Next, a contact hole 28 is formed in the insulating film 20 and reflection preventing film 22 by a dry etching process using the resist layer 24 with the opening as a mask (FIG. 1N). Since the reflection preventing film 22 is formed on the insulating film 20, light reflection from the insulating film 20 and wiring layer 18 is suppressed during the resist exposure process. It is therefore possible to form the opening as designed and obtain the contact hole 28 as designed by the selective etching process. It is not necessary to design the width of the wiring layer 18 wider than the desired width, by taking into consideration a possible distortion or enlargement of the resist opening pattern. The integration degree can be improved correspondingly.

Next, the resist layer 24 is removed. A wiring material such as Al and Al alloy is deposited on the upper surface of the substrate, and patterned to form another wiring layer 30 (FIG. 2). In this patterning, the remaining portion 22A of the reflection preventing layer 22 is patterned at the same time, and is used as part of the wiring layer 30. This wiring layer 30 has a two-layer structure made of Al or Al alloy and the underlie TiN layer, providing a high resistance against electromigration and stress migration and a high reliability.

Next, conditions for the thickness of the TiN film deposited on the interlayer insulating film will be shown. Before resolving the condition, will be described the phenomena which are considered to arise when an interlayer insulating film, TiN film and resist film are deposited in this order from the lower side to the upper side and then contact holes reaching the second metal layer are patterned by utilizing ultra violet light irradiated from above the wiring.

The refractive indices of the interlayer insulating film, TiN film, and resist film are respectively, interlayer insulating film:
n=1.45−1.5, k=0,
TiN: n=2.3, k=−1.2, and
resist: n=1.67, k=0.03.

The refractive indices are greatly different between the interlayer insulating film and the TiN film, and between the TiN film and the resist film. Therefore, when a light passes through these interfaces, reflection occurs at the interface between the respective layers. This occurs when the thickness of the TiN film is thin. In such a case, the light incident on the resist film causes multiple reflection. The multiple reflection occurs as follows. The light incident on the resist film is transmitted in the resist film and reach the interface between the TiN film and resist film, and partially reflected at the interface. The remaining light is further transmitted in the TiN film, while being gradually attenuated, to reach the interface between the interlayer insulating film and the TiN film. The light reaching at the interface between TiN film and the interlayer insulating film are partially reflected to the TiN film side. The remaining part of the light goes into the interlayer insulating film. Such a light which is incident on the interlayer insulating film is transmitted through the interlayer insulating film. When the light reaches an interface of the interlayer insulating film and a aluminum or aluminum alloy film, the light is reflected at the surface of the aluminum or aluminum alloy film deposited at the lower part. The reflected light may further be reflected at the surface of the interface between interlayer insulating film and the TiN film down to the interlayer insulating film. The remaining part of the light proceeds toward the upper surface. Part of the transmitted light is reflected at the interface between the TiN film and the resist film and goes downward. The remaining light goes into and proceeds in the resist film. Multiple reflection occurs through repetition of such reflections, causing scattering of light.

Figure 5:
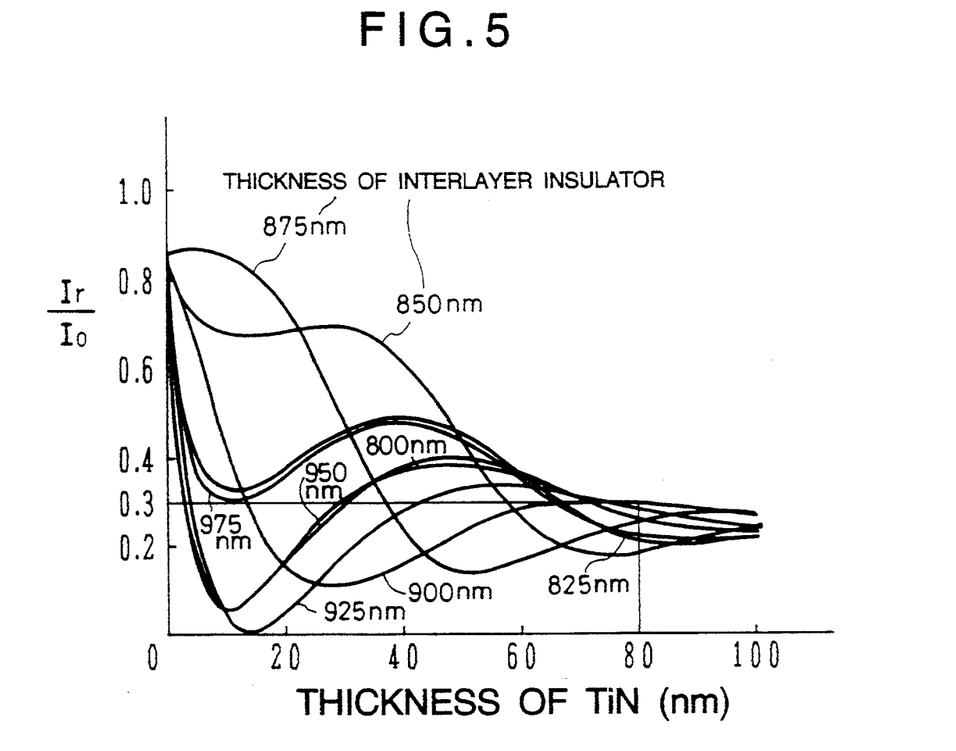
FIG. 5 illustrates the reflectance of different thicknesses of a titanium nitride film.

Therefore, it is preferable to control the thickness of the TiN film to prevent the passage of the light. The inventor made a model in which, on an aluminum alloy layer deposited as the second metal layer, an interlayer insulating film made of SiO$_2$, a reflection-preventing film, and a positive type photoresist film are deposited in this order to form a wiring structure, and light of g-line from mercury lamp (wave length 436 nm) is normally (perpendicularly) irradiated on the surface. The inventor calculated the change of the ratio of the reflected light intensity $I_r$ to the incident light intensity $I_o$, i.e. $I_r/I_o$ (ordinate) with respect to the thickness of the TiN film (abscissa). Here, the thickness of the interlayer insulating film was also changed from 800 nm to 975 nm. The results are shown in FIG. 5.

From the calculation results, it was found that good results can be obtained by depositing such a reflection-preventing film, typically of TiN, on the interlayer insulating film that the below-mentioned conditions (a) and (b) are satisfied.

(a) The reflectivity ($I_r/I_o$) does not vary greatly even if the thickness of the interlayer insulating film varies.

The interlayer insulating film may be formed by deposition (CVD). Thus, it is not easy to accurately control the thickness of the interlayer insulating film. Further, in the multilayer wiring structure, the second metal layer is not flat in most of the cases. Therefore, the interlayer insulating film deposited thereon will become also uneven. Thus, the thickness of the interlayer insulating film with respect to the direction of the incident light for patterning the second metal layer varies greatly depending on the location in the film. As can be clearly seen from FIG. 5, if the thickness of the anti-reflection film made of such material as TiN is too thin, the reflectivity varies greatly depending on the thickness of the interlayer insulating film deposited below. Therefore, even when a thin anti-reflection film is deposited on the interlayer insulating film which has greatly different thickness depending on the location, variation of the reflectivity can not be suppressed sufficiently, and it is difficult to improve the patterning accuracy of the contact hole reaching second metal layer.

(b) The ratio $I_r/I_o$ is below or equal to 0.3. A positive type photoresist is used as a resist. The smaller the light quantity irradiated, the better the result is. Considering the sensitivity of the resist, the effect is satisfactory when the reflectivity $I_r/I_o$ is below or equal to 0.3.

From the results shown in FIG. 5 and the condition (a) and (b), a TiN film having a thickness of 80 nm or more deposited on the interlayer insulating film will function sufficiently as a reflection-preventing film.

In an embodiment of the present invention, aluminum or aluminum alloy is used as a wiring layer. As alternatives, tungsten (W), copper (Cu) or refractory metal silicide such as tungsten silicide (WSi$_2$), molybdenum silicide (MoSi$_2$), titanium silicide (TiSi$_2$) can be used.

Thus, an embodiment of a novel manufacturing method of a semiconductor device has been disclosed. Although the embodiment has been described in some detail, various changes could be made by those skilled in the art without departing from the spirit and scope of the invention as defined by the appended claims.

We claim:

1. A method of forming a multilayered wiring, comprising the steps of:
   (a) forming a first wiring layer on the insulative surface of a substrate;
   (b) forming an interlayer insulating film on said first wiring layer and covering the insulating surface of said substrate;
   (c) forming a reflection preventing film on said interlayer insulating film;
   (d) forming a resist layer on said reflection preventing film, and exposing and developing said resist layer to form an opening corresponding to a contact hole;
   (e) selectively etching the laminated structure of said reflection preventing film and said interlayer insulating film by using said resist film as a mask to form said contact hole down to the surface of said first wiring layer;
   (f) removing at least said resist layer among said resist layer and said reflection preventing layer; and
   (g) forming a second wiring layer on said interlayer insulating film and electrically connecting said second wiring layer to said first wiring layer via said contact hole.

2. A method according to claim 1, wherein in said step (f), said reflection preventing film is left unetched, and in said step (g), a conductive film is formed on said reflection preventing film, and said conductive layer and said reflection preventing film are patterned, whereby said reflection preventing film left unetched when said contact hole is formed is used as part of said second wiring layer.

3. A method according to claim 2, wherein said second wiring layer comprises an Al layer or an Al alloy layer.

4. A method according to claim 1, wherein said reflection preventing film comprises a TiN layer.

5. A method according to claim 4, wherein said first wiring layer has a laminated structure of a TiN layer and an Al or Al alloy layer.

6. A method of manufacturing a multi-level wiring structure for a semiconductor device provided on a semiconductor substrate, comprising the steps of:
   (a) providing the semiconductor substrate;
   (b) forming a thick field insulating film in the semiconductor substrate;
   (c) forming a first level metal wiring on and a source and a drain region in the semiconductor substrate;
   (d) forming a first level interlayer insulating film over the first level metal wiring and the semiconductor substrate, the first level interlayer insulating film having a corrugated structure caused by the thick field insulating film, and the first level wiring;
   (e) forming a second level metal wiring on the first level interlayer insulating film, the second level metal wiring having an uneven surface caused by the first level interlayer insulating film and a high reflectance property with respect to ultra-violet light;

(f) forming a second level interlayer insulating film over the second level metal wiring and the first level interlayer insulating film;

(g) depositing a reflection preventing film having a thickness of at least about 80 nm over the second level interlayer insulating film;

(h) forming a positive type resist layer over the reflection preventing film;

(i) subjecting the semiconductor substrate to ultraviolet light to pattern a contact hole reaching the second level metal wiring film, wherein the reflection preventing film constrains a multi-reflection of the ultra-violet light to thereby improve patterning accuracy.

7. A method of manufacturing a multi-level wiring structure for a semiconductor device having a plurality of device elements on a semiconductor substrate, comprising the steps of:

(a) providing the semiconductor substrate;

(b) forming the plurality of device elements on the semiconductor substrate;

(c) forming a first interlayer insulating film over the device elements, the first level interlayer insulating film having a corrugated surface caused by the device elements;

(d) forming a metal wiring layer, having an uneven surface, over the first level interlayer insulating film;

(e) forming a second interlayer insulating film over the metal wiring layer;

(f) depositing a reflection preventing film having a thickness of at least about 80 nm over the second interlayer insulating film;

(g) forming a resist layer over the reflection preventing film;

(h) subjecting the semiconductor substrate to ultraviolet light to pattern a contact hole reaching the metal wiring layer, wherein the reflection preventing film constrains a multi-reflection of the ultraviolet to thereby improve patterning accuracy.

8. A method of manufacturing a multi-level wiring structure according to claim 7, wherein the ultra-violet comprises a mercury emission line having a wavelength at or near 436 nm.

9. A method of manufacturing a multi-level wiring structure according to claim 7, wherein the reflection preventing film comprises TiN film.

10. A method of forming multilayered wiring, comprising the steps of:

(a) forming a conductive layer on a semiconductor body;

(b) forming an interlayer insulating film on said conductive layer;

(c) forming a reflection prevention film on said interlayer insulating film, said reflection prevention film suppressing light reflection;

(d) forming a resist pattern on said reflection prevention film; and (e) forming a contact hole down to the surface of said conductive layer through said reflection prevention film and said interlayer insulating film by using said resist pattern.

11. A method according to claim 10, wherein said step (d) comprises the steps of:

(d-1) forming a resist layer on said reflection prevention film; and (d-2) exposing said resist layer to an ultra violet ray through a desired mask pattern.

12. A method according to claim 10, wherein said reflection prevention film formed in step (c) comprises TiN.

13. A method according to claim 10, wherein said conductive layer formed in step (a) comprises polycrystalline silicon.

14. A method of forming a multilayered wiring, comprising the steps of:

(a) forming a first wiring layer on a semiconductor body;

(b) forming an interlayer insulating film on said first wiring layer;

(c) forming a reflection prevention film having a thickness of about 80 nm or more on said interlayer insulating film, said reflection prevention film suppressing light reflection;

(d) forming a resist pattern on said reflection prevention film; and (e) forming a contact hole down to the surface of said first wiring layer through said reflection prevention film and said interlayer insulating film by using said resist pattern.

15. A method according to claim 14, wherein said step (d) comprises the steps of:

(d-1) forming a resist layer on said reflection prevention film; and (d-2) exposing said resist layer to ultra violet light through a desired mask pattern.

16. A method according to claim 15, wherein said ultra violet light used to expose said resist layer in step (d-2) primarily consists of light having a wavelength of about 436 nm.

17. A method according to claim 14, wherein said reflection prevention film formed in step (c) comprises TiN.

18. A method according to claim 14, wherein reflection prevention film formed in step (c) suppresses a ratio of reflected light intensity to incident light intensity of about 0.3 or less.

* * * * *

UNITED STATES PATENT AND TRADEMARK OFFICE
CERTIFICATE OF CORRECTION

PATENT NO. : 5,403,781
DATED : April 4, 1995
INVENTOR(S) : Yasuhiko Matsumoto, et al.

It is certified that error appears in the above-indentified patent and that said Letters Patent is hereby corrected as shown below:

In the Drawings:

Delete FIG. 1N, and substitute therefor attached FIG. 1N.

Signed and Sealed this

Twenty-eighth Day of November 1995

Attest:

BRUCE LEHMAN

Attesting Officer

Commissioner of Patents and Trademarks

FIG. 1N